(12) United States Patent
Park et al.

(10) Patent No.: US 12,501,664 B2
(45) Date of Patent: Dec. 16, 2025

(54) THIN FILM TRANSISTOR SUBSTRATE AND DISPLAY DEVICE COMPRISING THE SAME

(71) Applicant: LG Display Co., Ltd., Seoul (KR)

(72) Inventors: SeHee Park, Gyeonggi-do (KR); KwangMin Jo, Paju-si (KR); JeongWoo Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 689 days.

(21) Appl. No.: 17/901,192

(22) Filed: Sep. 1, 2022

(65) Prior Publication Data

US 2023/0071859 A1    Mar. 9, 2023

(30) Foreign Application Priority Data

Sep. 3, 2021 (KR) .................. 10-2021-0117990
Dec. 31, 2021 (KR) .................. 10-2021-0194208

(51) Int. Cl.
*H10D 30/67* (2025.01)
*H10K 59/121* (2023.01)

(52) U.S. Cl.
CPC ..... *H10D 30/6757* (2025.01); *H10D 30/6723* (2025.01); *H10D 30/6755* (2025.01); *H10K 59/1213* (2023.02)

(58) Field of Classification Search
CPC ........... H10D 30/6757; H10D 30/6723; H10D 30/6755; H10D 30/6734; H10D 86/423; H10D 86/425; H10D 86/60; H10K 59/1213; H10K 59/131
See application file for complete search history.

(56) References Cited

U.S. PATENT DOCUMENTS

| | | | |
|---|---|---|---|
| 9,711,651 B2* | 7/2017 | Yamazaki | H10D 99/00 |
| 10,249,236 B2 | 4/2019 | Choi | |
| 10,386,670 B2* | 8/2019 | Uchida | G02F 1/1368 |
| 2021/0066423 A1* | 3/2021 | Lee | H10K 59/40 |

FOREIGN PATENT DOCUMENTS

| | | |
|---|---|---|
| JP | 2011082486 A | 4/2011 |
| JP | 5468612 B2 | 4/2014 |
| KR | 10-2017-0045781 A | 4/2017 |
| KR | 20200048910 A | 5/2020 |
| KR | 20210025738 A | 3/2021 |
| KR | 10-2021-0055304 A | 5/2021 |

* cited by examiner

*Primary Examiner* — Tan N Tran
(74) *Attorney, Agent, or Firm* — Seed Intellectual Property Law Group LLP

(57) ABSTRACT

A thin film transistor substrate and a display device comprising the same are provided, in which the thin film transistor substrate comprises a first thin film transistor and a second thin film transistor on a base substrate, wherein the first thin film transistor includes a first active layer on the base substrate, and a first gate electrode spaced apart from the first active layer, the second thin film transistor includes a second active layer on the base substrate, a second gate electrode spaced apart from the second active layer, and an auxiliary gate electrode between the second active layer and the second gate electrode, the first active layer and the second active layer are integrally formed and connected to each other, the auxiliary gate electrode is integrally formed with the first gate electrode and spaced apart from the second active layer and the second gate electrode, and the second gate electrode overlaps at least a portion of the auxiliary gate electrode.

25 Claims, 9 Drawing Sheets

THIN FILM TRANSISTOR SUBSTRATE AND DISPLAY DEVICE COMPRISING THE SAME

CROSS-REFERENCE TO RELATED APPLICATIONS

This application claims the benefit of priorities of the Korean Patent Application No. 10-2021-0117990 filed on Sep. 3, 2021 and Korean Patent Application No. 10-2021-0194208 filed on Dec. 31, 2021, which are hereby incorporated by reference as if fully set forth herein.

BACKGROUND

Technical Field

The present disclosure relates to a thin film transistor substrate and a display device comprising the same.

Description of the Related Art

A display device has become more important with the development of multimedia, and a flat panel display device such as a liquid crystal display device, a plasma display device, and an organic light emitting display device has been commercially used.

Thin film transistors having various functions are disposed in the flat panel display device. For example, the organic light emitting display device includes a driving transistor for driving a pixel and a switching transistor for controlling the driving transistor. In order to improve display quality and efficiently control light emission of a pixel, various thin film transistors such as a transistor for controlling light emission and a transistor for sensing a function of the transistor may be disposed in the display device.

Recently, with high quality and high resolution of a display device, thin film transistors have been integrated into the display device with high density.

BRIEF SUMMARY

Integrating the thin film transistors into the display device with high density creates a number of technical problems. Since a large number of thin film transistors are disposed in a limited area, there may be a problem in that a capacitor area is not sufficiently ensured. Therefore, when a large number of thin film transistors are disposed in the display device, it is beneficial to efficiently dispose the thin film transistors and lines connected thereto.

One or more embodiments of the present disclosure addresses one or more problems in the related art including the above problems as identified by the inventors. One or more embodiments of the present disclosure provide a thin film transistor substrate in which a large number of thin film transistors and lines connected thereto may be disposed efficiently.

One or more embodiments of the present disclosure provide a thin film transistor substrate that may allow a function of a thin film transistor to be actively exerted even though a signal line overlaps a gate electrode of the thin film transistor.

One or more embodiments of the present disclosure provide a display device comprising the thin film transistor substrate described as above.

One or more embodiments of the present disclosure provide a display device that may actively control driving of a driving transistor even though an emission control line for light emission control overlaps a gate electrode of the driving transistor.

In addition to the technical benefits of the present disclosure as mentioned above, additional benefits and features of the present disclosure will be clearly understood by those skilled in the art from the following description of the present disclosure.

In accordance with an aspect of the present disclosure, the above and other benefits can be accomplished by the provision of a thin film transistor substrate including a first thin film transistor and a second thin film transistor on a base substrate, wherein the first thin film transistor includes a first active layer on the base substrate, and a first gate electrode spaced apart from the first active layer, the second thin film transistor includes a second active layer on the base substrate, a second gate electrode spaced apart from the second active layer, and an auxiliary gate electrode between the second active layer and the second gate electrode, the first active layer and the second active layer are integrally formed and connected to each other, the auxiliary gate electrode is integrally formed with the first gate electrode and spaced apart from the second active layer and the second gate electrode, and the second gate electrode overlaps at least a portion of the auxiliary gate electrode.

The same voltage as that of the first gate electrode may be applied to the auxiliary gate electrode.

The first thin film transistor may be configured to be turned on when the second thin film transistor is turned on.

A first gate voltage may be applied to the first gate electrode when a second gate voltage is applied to the second gate electrode.

The second active layer may include a channel portion, a first connection portion that is in contact with one side of the channel portion, and a second connection portion that is in contact with the other side of the channel portion, and a portion of the channel portion may overlap the auxiliary gate electrode, and the other portion of the channel portion may not overlap the auxiliary gate electrode.

The other portion of the channel portion, which does not overlap the auxiliary gate electrode, may overlap the second gate electrode.

A portion of the channel portion, which is toward the first connection portion, may overlap the auxiliary gate electrode and may not overlap the second gate electrode.

A portion of the channel portion, which is toward the second connection portion, may overlap the auxiliary gate electrode and may not overlap the second gate electrode.

The first active layer and the second active layer may include at least one of an IGZO(InGaZnO)-based oxide semiconductor material, an IZO(InZnO)-based oxide semiconductor material, an IGZTO(InGaZnSnO)-based oxide semiconductor material, an ITZO(InSnZnO)-based oxide semiconductor material, a FIZO(FeInZnO)-based oxide semiconductor material, a ZnO-based oxide semiconductor material, a SIZO(SiInZnO)-based oxide semiconductor material, a ZnON(Zn-Oxynitride)-based oxide semiconductor material, a GZO(GaZnO)-based oxide semiconductor material, an IGO(InGaO)-based oxide semiconductor material, or a GZTO(GaZnSnO)-based oxide semiconductor material.

Each of the first active layer and the second active layer may include a first oxide semiconductor layer, and a second oxide semiconductor layer on the first oxide semiconductor layer.

The thin film transistor substrate may further comprise a first light shielding layer on the base substrate, and a second light shielding layer on the first light shielding layer, wherein the first light shielding layer and the second light shielding layer may be spaced apart from each other and overlap each other, one of the first light shielding layer and the second light shielding layer may be connected to the second active layer, and the other one of the first light shielding layer and the second light shielding layer may be connected to the second gate electrode.

The first light shielding layer and the second light shielding layer may form a capacitor.

In accordance with another aspect of the present disclosure, the above and other benefits can be accomplished by the provision of a display device comprising the above thin film transistor.

The first thin film transistor may be a light emitting control transistor, and the second thin film transistor is a driving transistor.

An emission control signal may be applied to the first gate electrode and the auxiliary gate electrode.

The first gate electrode and the auxiliary gate electrode may be portions of the emission control line.

A storage capacitor may be formed by overlap between the first light shielding layer and the second light shielding layer.

The display device may further comprise a driving transistor, a light emitting control transistor, and a switching transistor, wherein an active layer of the driving transistor and an active layer of the light emitting control transistor may be integrally formed, and may be distinguished from an active layer of the switching transistor.

The display device may further comprise a sensing transistor, wherein an active layer of the sensing transistor may be integrally formed with the active layer of the driving transistor and the active layer of the light emitting control transistor, and may be distinguished from the active layer of the switching transistor.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1A:
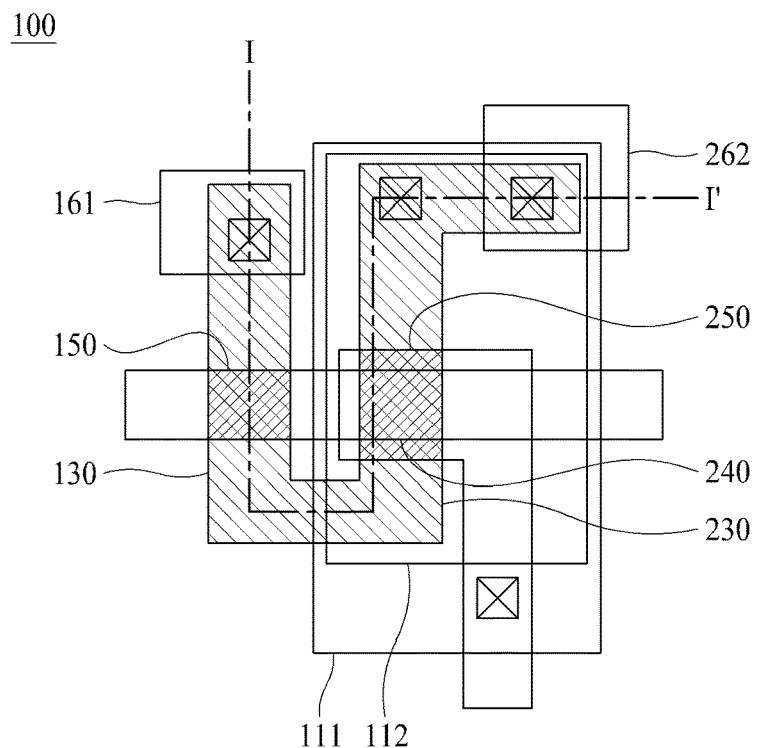
FIG. 1A is a plan view illustrating a thin film transistor substrate according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

Spatially relative terms such as "below," "beneath," "lower," "above," and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below," or "beneath" another device may be arranged "above" another device. Therefore, the term "below or beneath" may include "below or beneath" and "above" orientations. Likewise, the term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to partition one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region may be a source electrode, and a drain region may be a drain electrode. Also, a source region may be a drain electrode, and a drain region may be a source electrode.

Figure 1B:
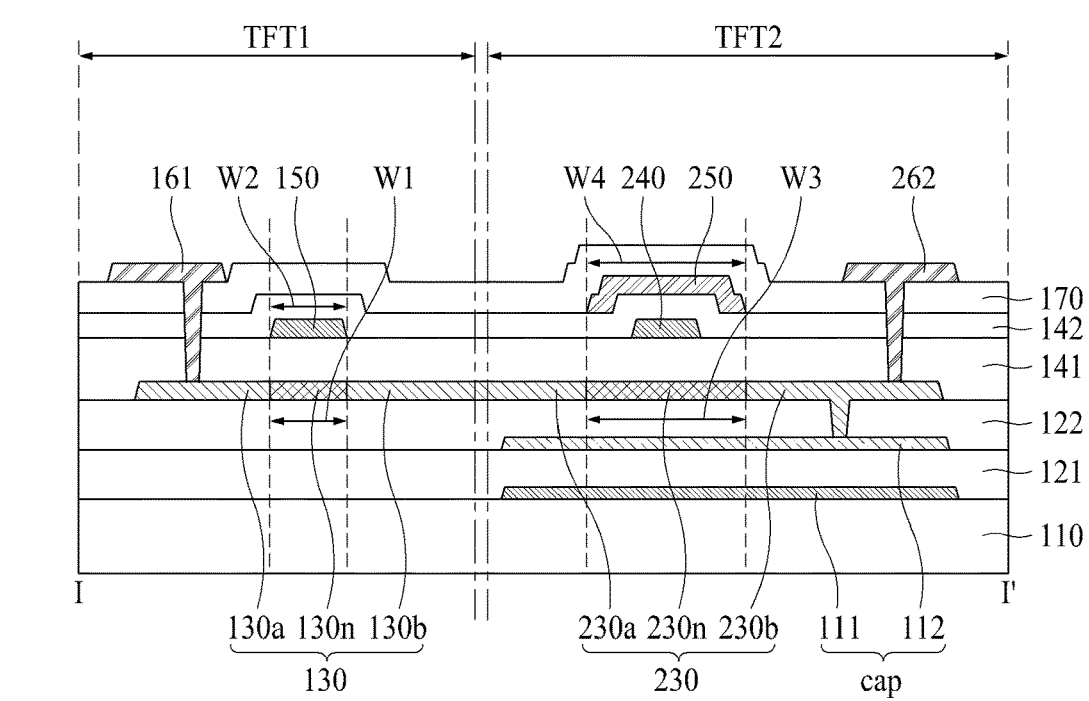
FIG. 1B is a cross-sectional view taken along line I-I' of FIG. 1A.

FIG. 1A is a plan view illustrating a thin film transistor substrate according to one embodiment of the present disclosure, and FIG. 1B is a cross-sectional view taken along line I-I' of FIG. 1A.

The thin film transistor substrate 100 according to one embodiment of the present disclosure includes a first thin film transistor TFT1 and a second thin film transistor TFT2 on a base substrate 110.

Referring to FIGS. 1A and 1B, the first thin film transistor TFT1 may include a first active layer 130 on the base substrate 110 and a first gate electrode 150 spaced apart from the first active layer 130. The second thin film transistor TFT2 may include a second active layer 230 on the base substrate 110, a second gate electrode 250 spaced apart from the second active layer 230, and an auxiliary gate electrode 240 between the second active layer 230 and the second gate electrode 250.

Hereinafter, each component of the thin film transistor substrate 100 according to one embodiment of the present disclosure will be described in detail.

Glass or plastic may be used as the base substrate 110. A transparent plastic, e.g., polyimide, which has a flexible property, may be used as the plastic. When the polyimide is used as the base substrate 110, a heat-resistant polyimide capable of enduring a high temperature may be used considering that a high temperature deposition process is performed on the base substrate 110.

Light shielding layers 111 and 112 may be disposed on the base substrate 110. The light shielding layers 111 and 112 may shield light incident from the outside to protect the thin film transistors TFT1 and TFT2. The light shielding layers 111 and 112 may be omitted.

According to one embodiment of the present disclosure, the light shielding layers 111 and 112 may overlap at least one of the first thin film transistor TFT1 or the second thin film transistor TFT2. In particular, the light shielding layers 111 and 112 may overlap the second thin film transistor TFT2.

Referring to FIGS. 1A and 1B, the first light shielding layer 111 may be disposed on the base substrate 110, and a first buffer layer 121 may be disposed on the first light shielding layer 111. The second light shielding layer 112 may be disposed on the first buffer layer 121, and a second buffer layer 122 may be disposed on the second light shielding layer 112.

The buffer layers 121 and 122 may be made of an insulating material. For example, the buffer layers 121 and 122 may include at least one of a silicon oxide, a silicon nitride, and an insulating material such as a metal-based oxide. The buffer layers 121 and 122 may have a single layered structure, or may have a multi-layered structure.

The buffer layers 121 and 122 may protect the active layers 130 and 230 by shielding the air and water. Further, a surface of the base substrate 110 on which the light shielding layers 111 and 112 are disposed may become uniform by the buffer layers 121 and 122.

The first light shielding layer 111 and the second light shielding layer 112 may be spaced apart from each other to overlap each other. One of the first light shielding layer 111 and the second light shielding layer 112 may be connected to the second active layer 230, and the other one of the first light shielding layer 111 and the second light shielding layer 112 may be connected to the second gate electrode 250. In detail, the first light shielding layer 111 may be connected to the second gate electrode 250, and the second light shielding layer 112 may be connected to the second active layer 230.

In FIGS. 1A and 1B, the first light shielding layer 111 is connected to the second gate electrode 250 through a contact hole, and the second light shielding layer 112 is connected to a second connection portion 230b of the second active layer 230 through the contact hole.

According to one embodiment of the present disclosure, the first light shielding layer 111 and the second light shielding layer 112 may form a capacitor.

Referring to FIG. 1B, the first active layer 130 and the second active layer 230 may be disposed on the second buffer layer 122.

Referring to FIGS. 1A and 1B, the first active layer 130 and the second active layer 230 may be integrally formed and connected to each other. That is, the first active layer 130 and the second active layer 230 is a single, continuous active layer. The first active layer 130, in operation, serves as a semiconductor layer of the first thin film transistor TFT1 and the second active layer 230, in operation, serves as a semiconductor layer of the second thin film transistor TFT2.

According to one embodiment of the present disclosure, the first active layer 130 and the second active layer 230 may be formed by the same semiconductor material. The first active layer 130 and the second active layer 230 may include an oxide semiconductor material.

The first active layer 130 and the second active layer 230 may include, for example, at least one of an IGZO(In-GaZnO)-based oxide semiconductor material, an IZO(In-ZnO)-based oxide semiconductor material, an IGZTO(In- GaZnSnO)-based oxide semiconductor material, an ITZO (InSnZnO)-based oxide semiconductor material, a FIZO (FeInZnO)-based oxide semiconductor material, a ZnO-based oxide semiconductor material, a SIZO(SiInZnO)-based oxide semiconductor material, a ZnON(Zn-Oxynitride)-based oxide semiconductor material, a GZO (GaZnO)-based oxide semiconductor material, an IGO (InGaO)-based oxide semiconductor material, or a GZTO (GaZnSnO)-based oxide semiconductor material.

However, one embodiment of the present disclosure is not limited to the above example, and the first active layer 130 and the second active layer 230 may be formed by another semiconductor material known in the art.

The first active layer 130 may include a channel portion 130n, a first connection portion 130a, and a second connection portion 130b. The first connection portion 130a of the first active layer 130 may be connected to one side of the channel portion 130n, and the second connection portion 130b may be connected to the other side of the channel portion 130n.

The second active layer 230 may include a channel portion 230n, a first connection portion 230a, and a second connection portion 230b. The first connection portion 230a of the second active layer 230 may be connected to one side of the channel portion 230n, and the second connection portion 230b may be connected to the other side of the channel portion 230n.

The first connection portions 130a and 230a and the second connection portions 130b and 230b may be formed by selective conductorization of the first active layer 130 and the second active layer 230. Selective conductorization can be carried out the doping selected regions of the active layer with the appropriate ions to change the conductivity and mobility of the carriers in that layer. The proper ions to use to modify the conductivity of an active layer are well known in the art depending on the conductive layer and thus the specific details are not provided here, but to provide just a few examples, it is well known for pure silicon as the active layer, doping with boron ions increases the holes and their mobility and doping with phosphorus and/or arsenic ions increases electrons and their mobility.

Referring to FIG. 1B, the second connection portion 130b of the first active layer 130 and the first connection portion 230a of the second active layer 230 may be connected to each other. Since the first active layer 130 and the second active layer 230 are made of the same material, a boundary between the second connection portion 130b of the first active layer 130 and the first connection portion 230a of the second active layer 230 may not be definite.

The first connection portions 130a and 230a and the second connection portions 130b and 230b are distinguished from each other for convenience of description, and their positions may be independently exchanged with each other.

Referring to FIG. 1B, a first gate insulating layer 141 is disposed on the first active layer 130 and the second active layer 230. The first gate insulating layer 141 may be disposed above the first active layer 130 and the second active layer 230 and above the second buffer layer 122.

The first gate insulating layer 141 has insulation properties, and protects the first active layer 130 and the second active layer 230. The first gate insulating layer 141 may include at least one of a silicon oxide, a silicon nitride, or a metal-based oxide. The first gate insulating layer 141 may have a single layered structure, or may have a multi-layered structure.

The first gate electrode 150 and the auxiliary gate electrode 240 are disposed on the first gate insulating layer 141.

Referring to FIGS. 1A and 1B, the auxiliary gate electrode 240 may be integrally formed with the first gate electrode 150. The auxiliary gate electrode 240 may be connected to the first gate electrode 150. In other words, the auxiliary gate electrode 240 is formed continuous and integral with the first gate electrode 150. That is, the first gate electrode 150 and the auxiliary gate electrode 240 are a single, continuous, and integrally formed electrode as shown in FIGS. 1A and 1B.

According to one embodiment of the present disclosure, the same voltage as that of the first gate electrode 150 may be applied to the auxiliary gate electrode 240. In detail, when a first gate voltage is applied to the first gate electrode 150, the first gate voltage may be also applied to the auxiliary gate electrode 240.

According to one embodiment of the present disclosure, the first gate electrode 150 and the auxiliary gate electrode 240 may be formed by a line passing through the first active layer 130 and the second active layer 230. For example, a portion of the line, which overlaps the first active layer 130, may be the first gate electrode 150.

Figure 2:
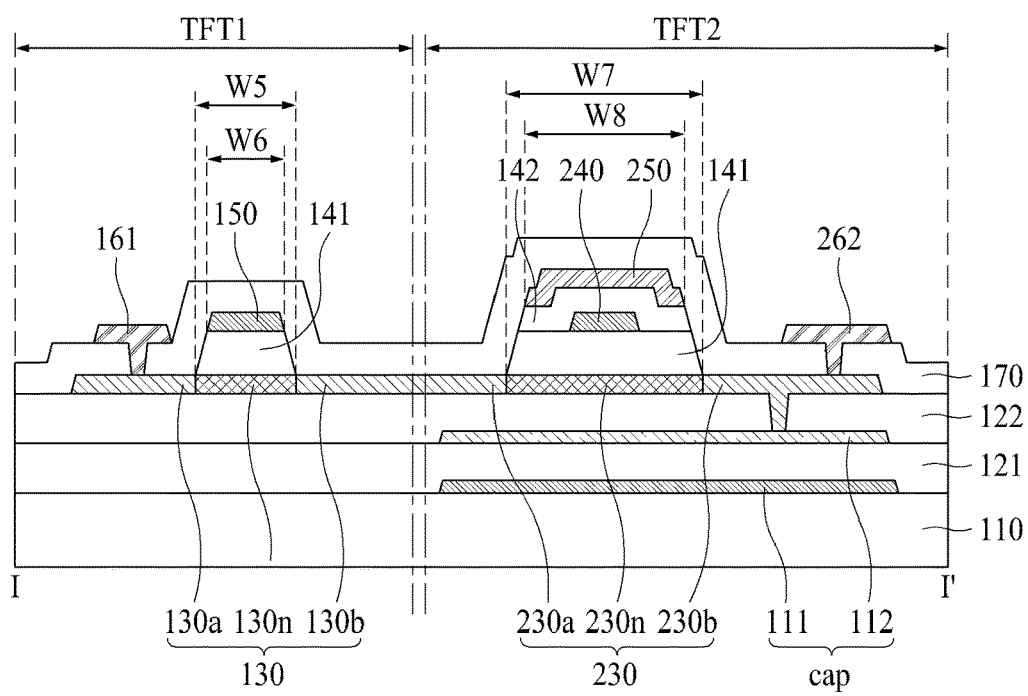
FIG. 2 is a cross-sectional view illustrating a thin film transistor substrate according to another embodiment of the present disclosure.

The first gate electrode 150 is spaced apart from the first active layer 130 and at least partially overlaps the first active layer 130. The first gate electrode 150 overlaps the channel portion 130n of the first active layer 130. As shown, a width W1 of the channel portion 130n of the first active layer 130 is equal to a width W2 of the first gate electrode 150. In another embodiment, a width W1 of the channel portion 130n of the first active layer 130 is greater than a width W2 of the first gate electrode 150 to fully overlap the first gate electrode 150. FIG. 2 illustrates a width of the channel portion 130n of the first active layer 130 being greater than a width of the first gate electrode 150 to fully overlap the first gate electrode 150. In FIG. 2, a width of the channel portion 130n of the first active layer 130 is denoted as width W5 and a width of the first gate electrode 150 is denoted as width W6.

A portion of the line passing through upper portions of the first active layer 130 and the second active layer 230, which overlaps the second active layer 230, may be the auxiliary gate electrode 240. Referring to FIG. 1B, the auxiliary gate electrode 240 is disposed to be spaced apart from the second active layer 230 and the second gate electrode 250.

A second gate insulating layer 142 is disposed on the first gate electrode 150 and the auxiliary gate electrode 240. The second gate insulating layer 142 may include at least one of a silicon oxide, a silicon nitride, or a metal-based oxide. The second gate insulating layer 142 may have a single layered structure, or may have a multi-layered structure.

Referring to FIG. 1B, the second gate insulating layer 142 may cover an entire area of an upper portion of the base substrate 110.

The second gate electrode 250 is disposed on the second gate insulating layer 142.

The second gate electrode 250 is spaced apart from the second active layer 230 and at least partially overlaps the second active layer 230. The second gate electrode 250 overlaps the channel portion 230n of the second active layer 230. As shown, a width W3 of the channel portion 230n of the second active layer 230 is equal to a width W4 of the second gate electrode 250. In another embodiment, a width W3 of the channel portion 230n of the second active layer 230 is greater than a width W4 of the second gate electrode 250 to fully overlap the second gate electrode 250. FIG. 2 illustrates a width of the channel portion 230n of the second active layer 230 being greater than a width of the second gate electrode 250 to fully overlap the second gate electrode 250. In FIG. 2, a width of the channel portion 230n of the second active layer 230 is denoted as width W7 and a width of the second gate electrode 250 is denoted as width W8.

According to one embodiment of the present disclosure, the auxiliary gate electrode 240 is disposed between the second active layer 230 and the second gate electrode 250.

According to one embodiment of the present disclosure, the second gate electrode 250 at least partially overlaps the auxiliary gate electrode 240. The second gate electrode 250 may cover the auxiliary gate electrode 240. Referring to FIGS. 1A and 1B, the second gate electrode 250 may cover the entire auxiliary gate electrode 240 on a plane.

Referring to FIG. 1B, the second gate electrode 250 may completely cover the auxiliary gate electrode 240 on a plan, but one embodiment of the present disclosure is not limited thereto, and the second gate electrode 250 may cover a portion of the auxiliary gate electrode 240 on the plane.

According to one embodiment of the present disclosure, the first connection portions 130a and 230a and the second connection portions 130b and 230b may be formed by conductorization using the first gate electrode 150 and the second gate electrode 250 as masks. For example, after the second gate electrode 250 is formed, the first active layer 130 and the second active layer 230 may be selectively conductorized by doping using the first gate electrode 150 and the second gate electrode 250 as masks. As a result, the first connection portion 130a and the second connection portion 130b of the first active layer 130 may be formed, and the first connection portion 230a and the second connection portion 230b of the second active layer 230 may be formed.

However, the conductorization method according to one embodiment of the present disclosure is not limited to doping, and may be performed by other methods known in the art. For example, conductorization may be performed by etching and plasma treatment of the gate insulating layers 141 and 142. By performing these methods, the channel portion 130n, 230n may be formed to have a different electrical characteristics and chemical characteristics from the adjacent connection portions (e.g., the first connection portions 130a and 230a and the second connection portions 130b and 230b).

An interlayer insulating layer 170 may be disposed on the second gate electrode 250. The interlayer insulating layer 170 is an insulating layer made of an insulating material. The interlayer insulating layer 170 may be made of an organic material, may be made of an inorganic material, or may be made of a stacked body of an organic layer and an inorganic layer.

A source electrode 161 of the first thin film transistor TFT1 and a drain electrode 262 of the second thin film transistor TFT2 may be disposed on the interlayer insulating layer 170. The source electrode 161 of the first thin film transistor TFT1 may be connected to the first active layer 130. The drain electrode 262 of the second thin film transistor TFT2 may be connected to the second active layer 230.

However, one embodiment of the present disclosure is not limited to the above example, and according to one embodiment of the present disclosure, a reference numeral "161" may be the drain electrode of the first thin film transistor TFT1. Also, a reference numeral "262" may be the source electrode of the second thin film transistor TFT2.

Each of the source electrode 161 of the first thin film transistor TFT1 and the drain electrode 262 of the second thin film transistor TFT2 may include at least one of molybdenum (Mo), aluminum (Al), chromium (Cr), gold (Au), titanium (Ti), nickel (Ni), neodymium (Nd), copper (Cu), or their alloy. Each of the source electrode 161 of the first thin film transistor TFT1 and the drain electrode 262 of the second thin film transistor TFT2 may be formed of a single layer made of a metal or an alloy of metals, and may be formed of two or more layers.

In general, a plurality of thin film transistors operate by being connected to each other in an electronic device. In the electronic device to which the first thin film transistor TFT1 and the second thin film transistor TFT2 according to one embodiment of the present disclosure are applied, the first active layer 130 and the second active layer 230 may be designed to be connected to each other. In this case, since the first active layer 130 and the second active layer 230 are connected to each other, a separate electrode or pad for connecting the first active layer 130 with the second active layer 230 is not required. Therefore, contact holes for connecting the first active layer 130 with the second active layer 230 may not be formed.

According to one embodiment of the present disclosure, one of the first connection portions 130a and 230a and the second connection portions 130b and 230b may be a source area, and the other one may be a drain area. The first connection portions 130a and 230a or the second connection portions 130b and 230b may serve as source electrodes or drain electrodes without a separate electrode or a separate pad member.

Figure 1C:
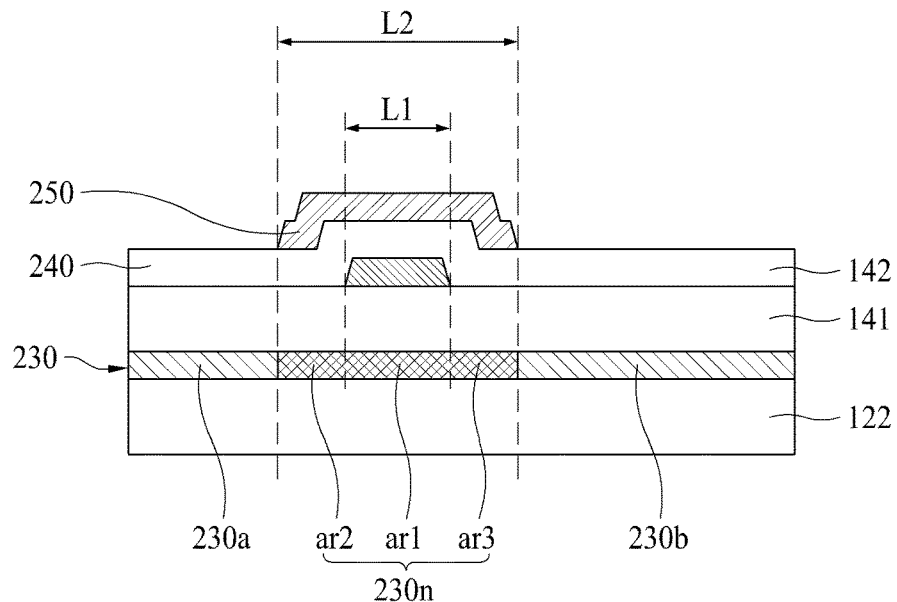
FIG. 1C is a partially enlarged view illustrating a channel portion of a second active layer, a second gate electrode, and an auxiliary gate electrode.

FIG. 1C is a partially enlarged view of the channel portion 230n of the second active layer 230, the second gate electrode 250, and the auxiliary gate electrode 240.

Referring to FIG. 1C, the auxiliary gate electrode 240 may be disposed between the second active layer 230 and the second gate electrode 250, and may be covered by the second gate electrode 250.

A length L2 of the second gate electrode 250 is greater than a length L1 of the auxiliary gate electrode 240. The length L2 of the second gate electrode 250 may be substantially the same as a length of the channel portion 230n of the second active layer 230.

A portion ar1 of the channel portion 230n of the second active layer 230 may overlap the auxiliary gate electrode 240, and the other portions ar2 and ar3 of the channel portion 230n of the second active layer 230 may not overlap the auxiliary gate electrode 240. In detail, the channel portion 230n of the second active layer 230 may include a first area ar1 overlapped with both the auxiliary gate electrode 240 and the second gate electrode 250, and second and third areas ar2 and ar3 overlapped with the second gate electrode 250 without overlapping the auxiliary gate electrode 240. The second and third areas ar2 and ar3 of the channel portion 230n of the second active layer 230 overlap the second gate electrode 250 without overlapping the auxiliary gate electrode 240.

Referring to FIG. 1C, the second area ar2 of the second channel portion 230n of the second active layer 230, which is a portion toward the first connection portion 230a, overlaps the second gate electrode 250 without overlapping the auxiliary gate electrode 240. Also, the third area ar3 of the channel portion 230n of the second active layer 230, which is a portion toward the second connection portion 230b, overlaps the second gate electrode 250 without overlapping the auxiliary gate electrode 240.

The length of the second area ar2 and the length of the third area ar3 may be the same as or different from each other. One of the second area ar2 and the third area ar3 may have a length greater than that of the other one.

Any one of the length of the second area ar2 and the length of the third area ar3 may be zero (0). In detail, any one of the second area ar2 and the third area ar3 may not be present. In this case, the other one of the second area ar2 and the third area ar3 should be present.

Since the auxiliary gate electrode 240 is connected to the first gate electrode 150, when a turn-on voltage is applied to the first gate electrode 150, the same turn-on voltage is also applied to the auxiliary gate electrode 240.

Since the second area ar2 and the third area ar3 of the channel portion 230n of the second active layer 230 do not overlap the auxiliary gate electrode 240, even though the turn-on voltage is applied to the auxiliary gate electrode 240, the channel portion 230n of the second active layer 230 does not have a current characteristic when the turn-on voltage is not applied to the second gate electrode 250. Therefore, even though the auxiliary gate electrode 240 is disposed to be closer to the second active layer 230 than the second gate electrode 250, the auxiliary gate electrode 240 does not control driving of the second thin film transistor TFT2 alone.

Also, an electric field applied by the second gate electrode 250 may be covered by the auxiliary gate electrode 240. Therefore, even though the turn-on voltage is applied to the second gate electrode 250, if the turn-on voltage is not applied to the auxiliary gate electrode 240, the channel portion 230n of the second active layer 230 does not have a current characteristic. Therefore, according to one embodiment of the present disclosure, when the turn-on voltage is applied to the second gate electrode 250 to drive the second thin film transistor TFT2, the turn-on voltage is applied to the auxiliary gate electrode 240. When the turn-on voltage is applied to the auxiliary gate electrode 240, the turn-on voltage may be applied to the second gate electrode 250.

According to one embodiment of the present disclosure, the first thin film transistor TFT1 is configured to be turned on at the time when the second thin film transistor TFT2 is turned on. The second thin film transistor TFT2 is turned on when the first thin film transistor TFT1 is in a turn-on state.

In addition, according to one embodiment of the present disclosure, when a second gate voltage is applied to the second gate electrode 250, a first gate voltage is applied to the first gate electrode 150. As a result, driving of the second thin film transistor TFT2 may be controlled by the second gate electrode 250.

According to one embodiment of the present disclosure, when the first thin film transistor TFT1 is turned on, the second thin film transistor TFT2 is not always turned on. On the other hand, the first thin film transistor TFT1 is turned on at a period where the second thin film transistor TFT2 is turned on. Also, even though the first thin film transistor TFT1 is in a turn-on state and the turn-on voltage is applied to the auxiliary gate electrode 240, the second thin film transistor TFT2 may be turned off by applying a turn-off voltage to the second gate electrode 250. Therefore, the turn-on and turn-off of the second thin film transistor TFT2 may be controlled by the second gate electrode 250.

FIG. 2 is a cross-sectional view illustrating a thin film transistor substrate 200 according to another embodiment of the present disclosure. In order to avoid redundancy, a description of the previously described components will be omitted.

Referring to FIG. 2, the first gate insulating layer 141 and the second gate insulating layer 142 may be patterned. The first gate insulating layer 141 and the second gate insulating layer 142 may be patterned by etching or ashing.

For example, after the first gate electrode 150, the auxiliary gate electrode 240, and the second gate electrode 250 are formed, the first gate insulating layer 141 and the second gate insulating layer 142 may be patterned using the first gate electrode 150 and the second gate electrode 250 as masks. As a result, the first gate insulating layer 141 may remain below the first gate electrode 150, and the first gate insulating layer 141 and the second gate insulating layer 142 may remain below the second gate electrode 250.

Figure 3A:
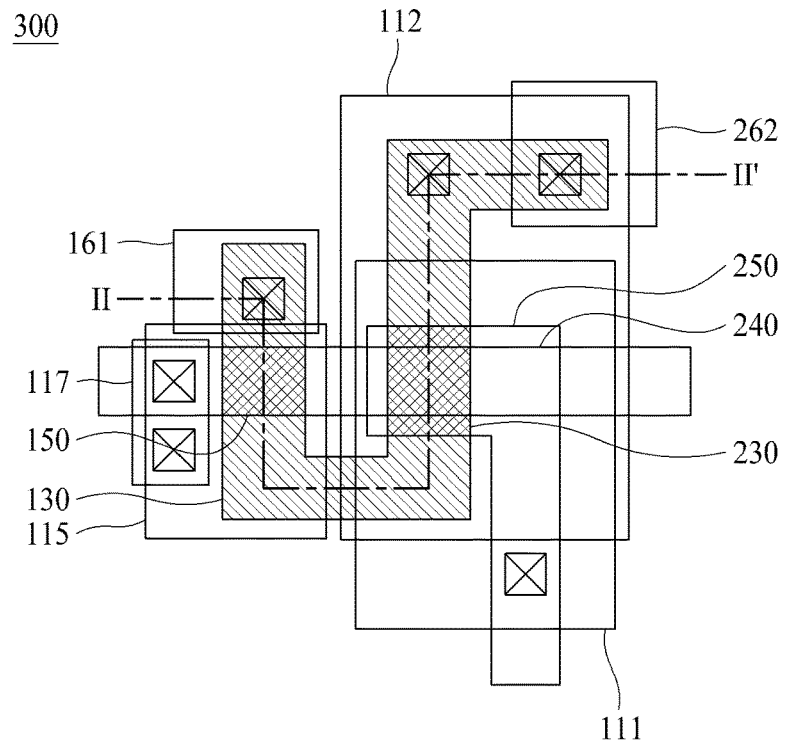
FIG. 3A is a plan view illustrating a thin film transistor substrate according to another embodiment of the present disclosure.
Figure 3B:
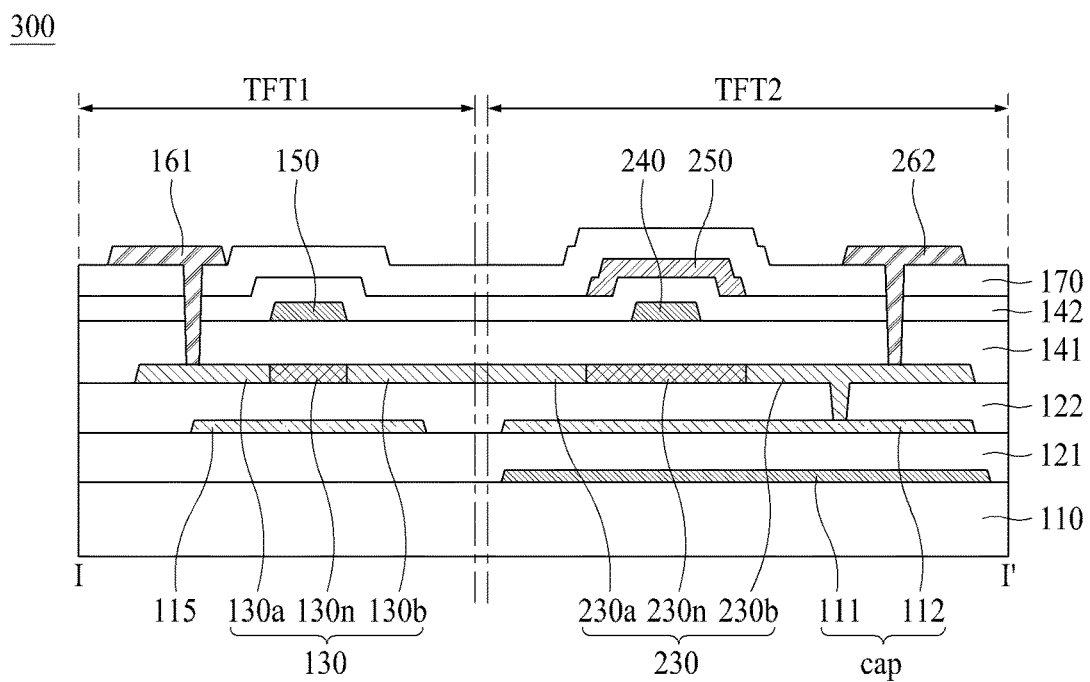
FIG. 3B is a cross-sectional view taken along line II-IP of FIG. 3A.

FIG. 3A is a plan view illustrating a thin film transistor substrate 300 according to another embodiment of the present disclosure, and FIG. 3B is a cross-sectional view taken along line II-IP of FIG. 3A.

Referring to FIGS. 3A and 3B, a first light shielding layer 111 may be disposed on a base substrate 110, a first buffer layer 121 may be disposed on the first light shielding layer 111, and a second light shielding layer 112 may be disposed on the first buffer layer 121. Also, an auxiliary light shielding layer 115 may be disposed on the first buffer layer 121.

Referring to FIGS. 3A and 3B, the first light shielding layer 111 may be connected to the second gate electrode 250 of the second thin film transistor TFT2 through the contact hole, and the second light shielding layer 112 may be connected to the second active layer 230 of the second thin film transistor TFT2 through the contact hole.

The first light shielding layer 111 and the second light shielding layer 112 may be spaced apart from each other and overlapped with each other to form a capacitor Cap.

Referring to FIGS. 3A and 3B, the auxiliary light shielding layer 115 may be connected to the gate electrode 150 of the first thin film transistor TFT1 through the connection electrode 117. In this case, the auxiliary light shielding layer 115 may serve as a gate electrode of the first thin film transistor TFT1. As a result, the first thin film transistor TFT1 may have a double gate structure.

Figure 4:
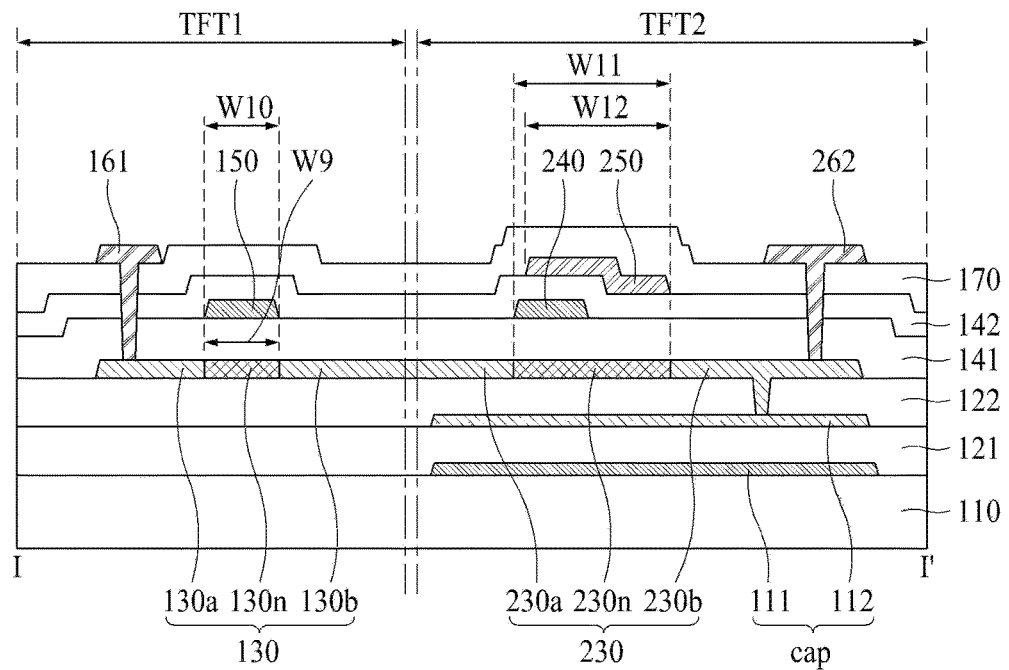
FIG. 4 is a cross-sectional view illustrating a thin film transistor substrate according to still another embodiment of the present disclosure.

FIG. 4 is a cross-sectional view illustrating a thin film transistor substrate 400 according to still another embodiment of the present disclosure.

Referring to FIG. 4, the auxiliary gate electrode 240 may be disposed on one side of the channel portion 230n of the second active layer 230. The second gate electrode 250 may cover at least a portion of the auxiliary gate electrode 240, and may be extended to the other side of the channel portion 230n of the second active layer 230. The second gate electrode 250 may not completely cover the auxiliary gate electrode 240.

According to still another embodiment of the present disclosure, the channel portion 230n of the second active layer 230 may overlap at least one of the second gate electrode 250 or the auxiliary gate electrode 240. At least a portion of the channel portion 230n of the second active layer 230 may overlap both the second gate electrode 250 and the auxiliary gate electrode 240.

A portion of the channel portion 230n of the second active layer 230, which is toward the first connection portion 230a, overlaps the auxiliary gate electrode 240, and may not overlap the second gate electrode 250. Although not shown in FIG. 4, a portion of the channel portion 230n of the second active layer 230, which is toward the second connection portion 230b, may overlap the auxiliary gate electrode 240, and may not overlap the second gate electrode 250.

As shown, a width W9 of the channel portion 130n of the first active layer 130 is equal to a width W10 of the first gate electrode 150. In another embodiment, a width W9 of the channel portion 130n of the first active layer 130 is greater than a width W10 of the first gate electrode 150 to fully overlap the first gate electrode 150. In addition, a width W11 of the channel portion 230n of the second active layer 230 is greater than a width W12 of the second gate electrode 250. FIG. 4 illustrates that the second gate electrode 250 and the auxiliary gate electrode 240 does not overlap with connection portion 230a. In one embodiment, as shown in FIG. 4, the second gate electrode 250 does not overlap with connection portion 230b.

FIG. 4 may correspond to a case that the length of the second area ar2 is zero (0) in FIG. 1C. Although the second gate electrode 250 and the auxiliary gate electrode 240 are disposed as shown in FIG. 4, since the first thin film transistor TFT1 maintains the turn-on state at a period where the second thin film transistor TFT2 is turned on, driving of the second thin film transistor TFT2 may be controlled by the second gate electrode 250.

Figure 5:
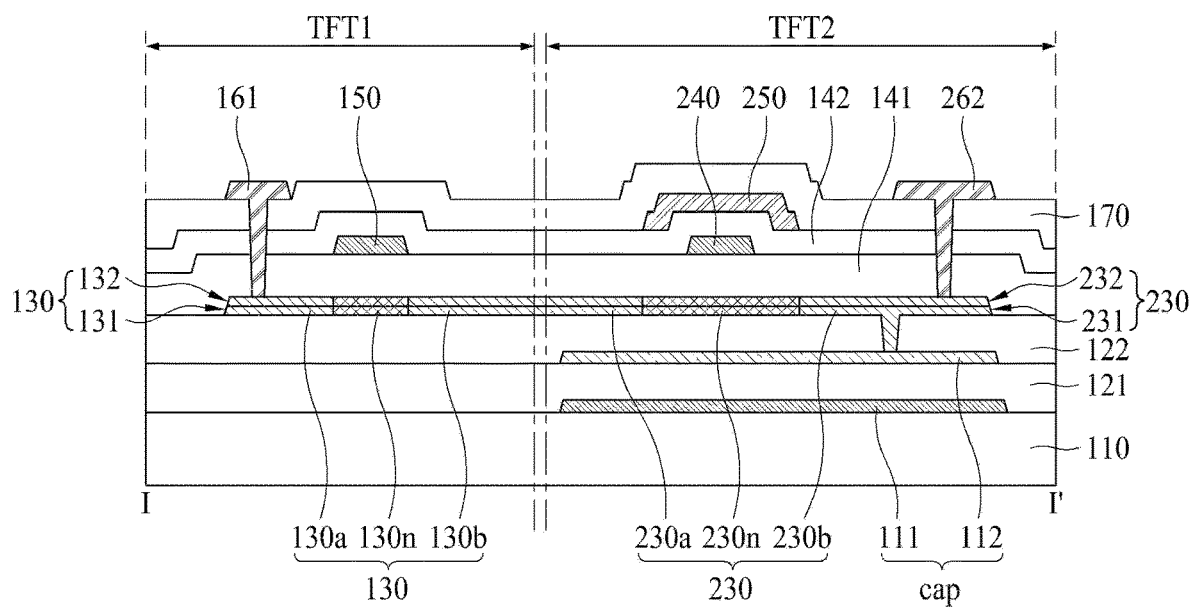
FIG. 5 is a cross-sectional view illustrating a thin film transistor substrate according to further still another embodiment of the present disclosure.

FIG. 5 is a cross-sectional view illustrating a thin film transistor substrate 500 according to further still another embodiment of the present disclosure.

Referring to FIG. 5, the first active layer 130 and the second active layer 230 may have a multi-layered structure. According to further still another embodiment of the present disclosure, the first active layer 130 and the second active layer 230 may include first oxide semiconductor layers 131 and 231 and second oxide semiconductor layers 132 and 232 on the first oxide semiconductor layers 131 and 231.

Since the first active layer 130 and the second active layer 230 may be formed together by the same composition, the first oxide semiconductor layer 131 of the first active layer 130 and the first oxide semiconductor layer 231 of the second active layer 230 may be the same as each other. In addition, the second oxide semiconductor layer 132 of the first active layer 130 and the second oxide semiconductor layer 232 of the second active layer 230 may be the same as each other.

The first oxide semiconductor layers 131 and 231 may have mobility greater than that of the second oxide semiconductor layers 132 and 232. Therefore, the first oxide semiconductor layers 131 and 231 may serve as main channel layers. The second oxide semiconductor layers 132 and 232 may serve as support layers.

The first oxide semiconductor layers 131 and 231 may be made of an oxide semiconductor material having high mobility characteristics. The second oxide semiconductor layers 132 and 232 may be made of an oxide semiconductor material having excellent film stability, but one embodiment of the present disclosure is not limited thereto. The first oxide semiconductor layers 131 and 231 may have excellent film stability while the second oxide semiconductor layers 132 and 232 may have high mobility characteristics.

As shown in FIG. 5, a structure in which the active layers 130 and 230 are formed by stacking two semiconductor layers will be referred to as a bi-layer structure.

Although not shown, a third oxide semiconductor layer may be disposed on the second oxide semiconductor layers 132 and 232.

Hereinafter, a display device to which the thin film transistor substrates 100, 200, 300, 400, and 500 described above are applied will be described in detail.

Figure 6:
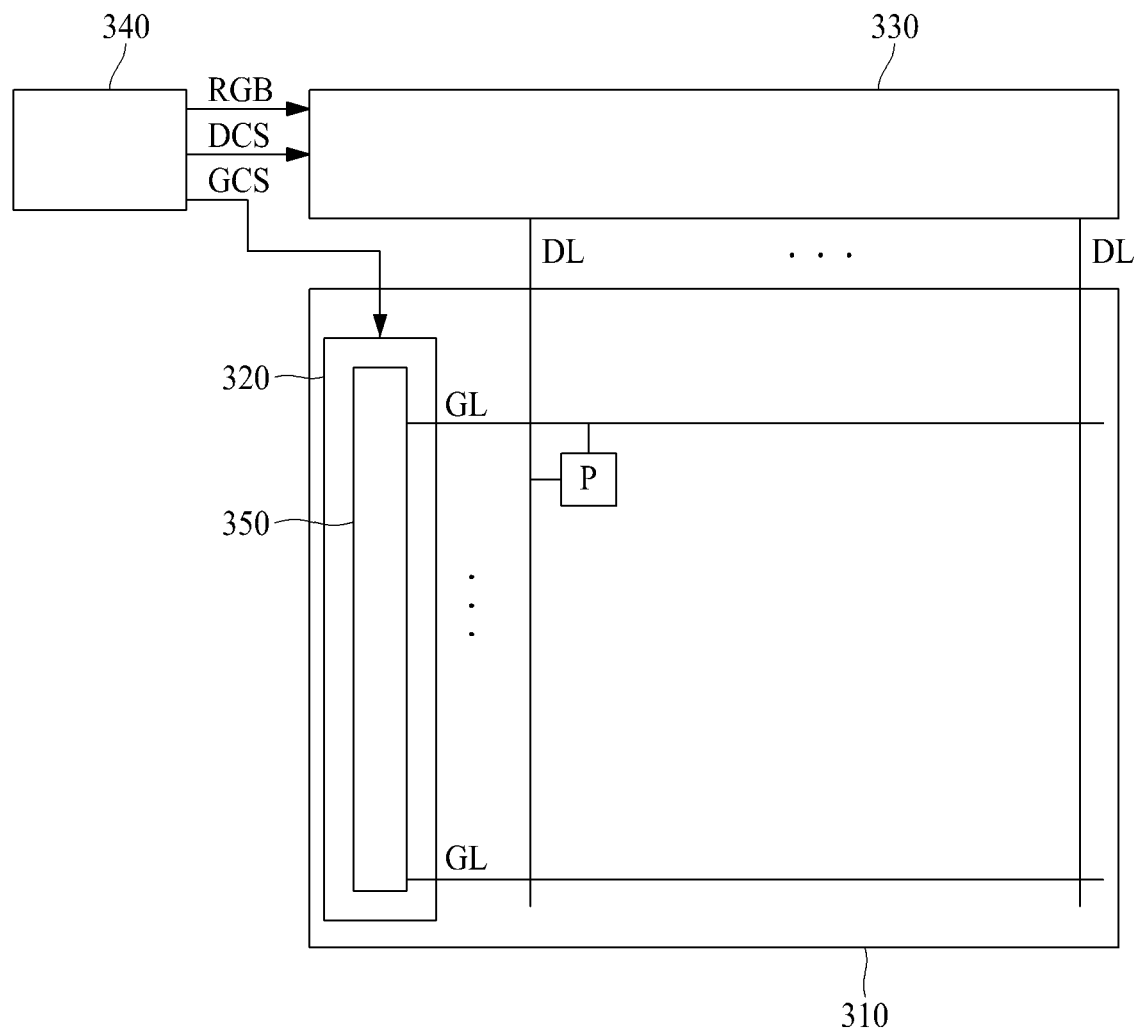
FIG. 6 is a schematic view illustrating a display device according to further still another embodiment of the present disclosure.

FIG. 6 is a schematic view illustrating a display device 600 according to further still another embodiment of the present disclosure.

As shown in FIG. 6, the display device 600 according to further still another embodiment of the present disclosure includes a display panel 310, a gate driver 320, a data driver 330 and a controller 340.

The display panel 310 includes gate lines GL and data lines DL, and pixels P are disposed in overlapping areas of the gate lines GL and the data lines DL. An image is displayed by driving of the pixels P.

The controller 340 controls the gate driver 320 and the data driver 330.

The controller 340 outputs a gate control signal GCS for controlling the gate driver 320 and a data control signal DCS for controlling the data driver 330 by using a signal that is supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage and supplies the data voltage to the data lines DL.

According to one embodiment of the present disclosure, the gate driver 320 may be packaged on the display panel 310. In this way, a structure in which the gate driver 320 is directly packaged on the display panel 310 will be referred to as a Gate In Panel (GIP) structure.

The gate driver 320 may include a shift register 350.

The shift register 350 sequentially supplies gate pulses to the gate lines GL for one frame by using the start signal and the gate clock, which are transmitted from the controller 340. In this case, one frame means a time period when one image is output through the display panel 310. The gate pulse has a turn-on voltage that may turn on a switching element (thin film transistor) disposed in the pixel P.

Also, the shift register 350 supplies a gate-off signal capable of turning off the switching element, to the gate line GL for the other period of one frame, at which the gate pulse is not supplied. Hereinafter, the gate pulse and the gate-off signal will collectively be referred to as a scan signal SS or Scan.

Figure 7:
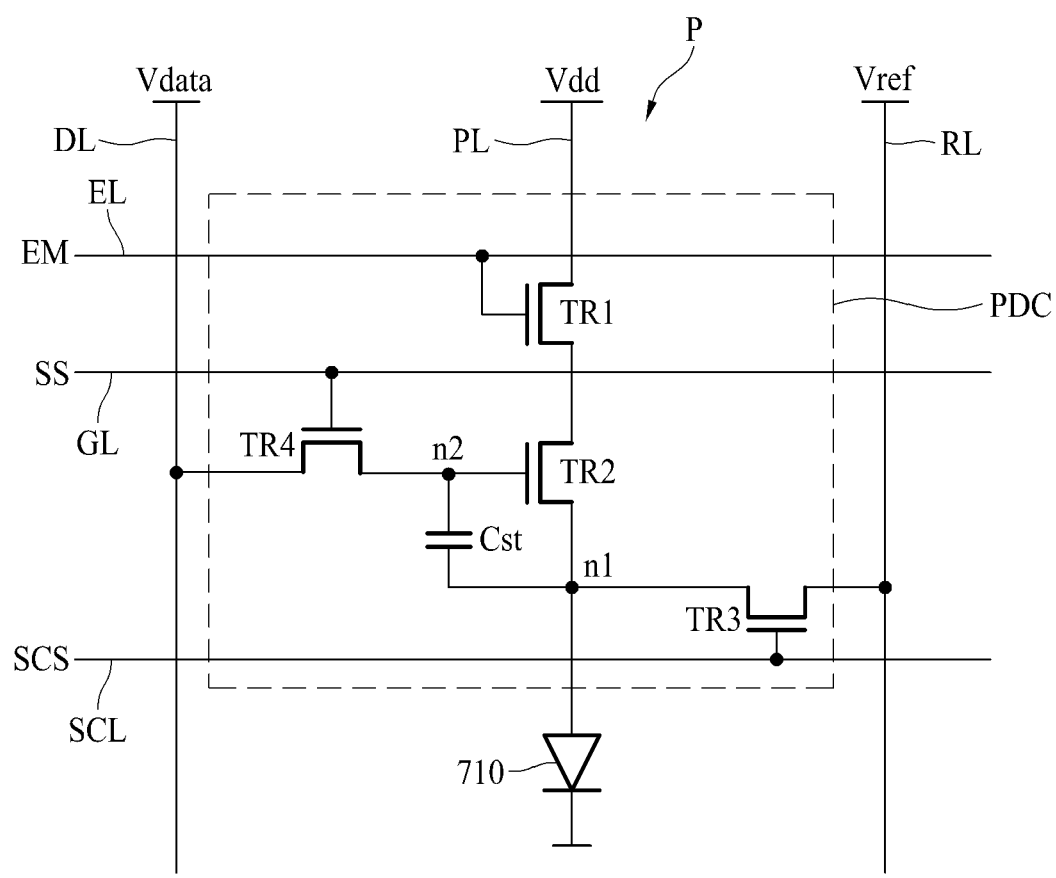
FIG. 7 is a circuit view illustrating any one pixel of FIG. 6.
Figure 8:
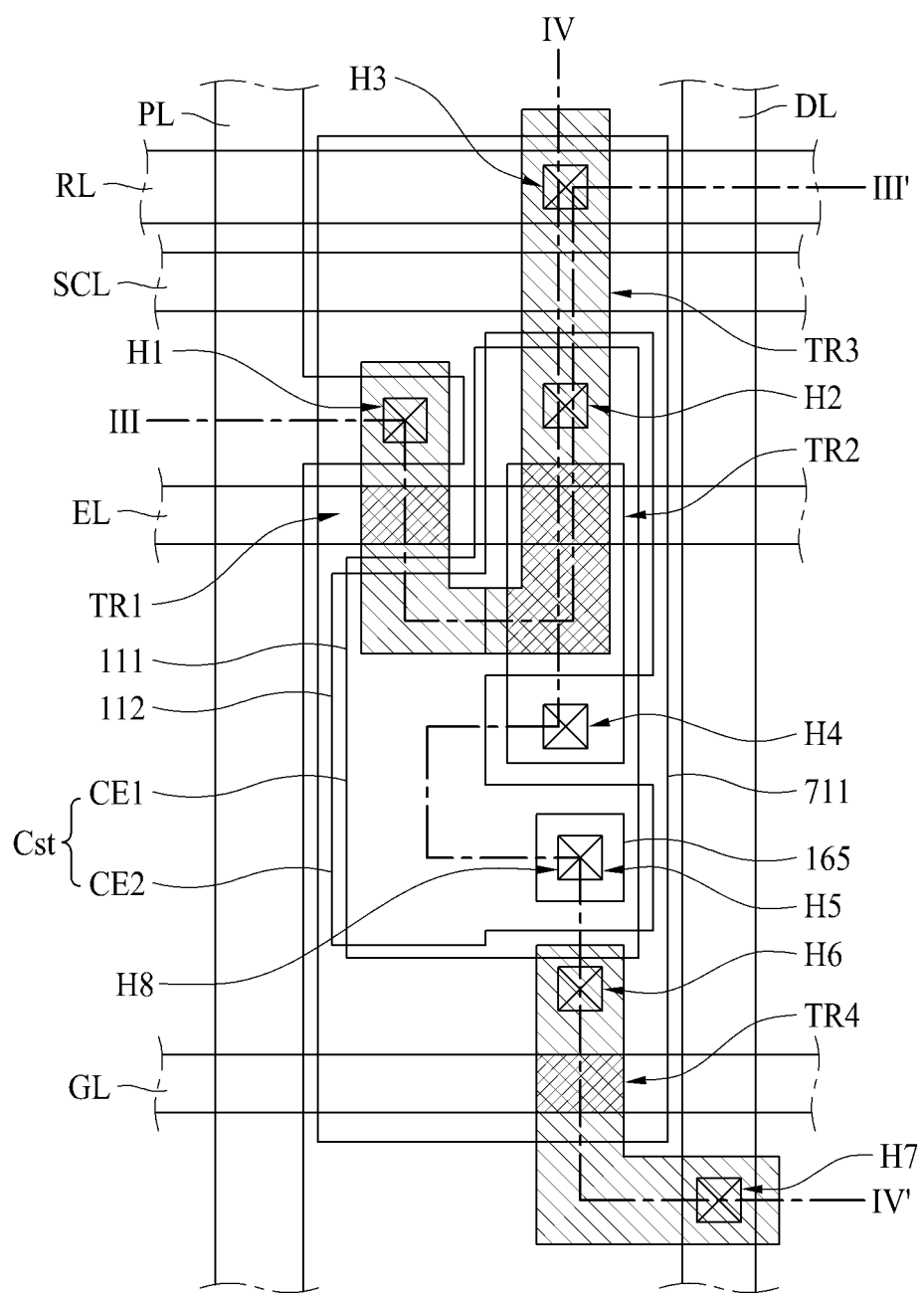
FIG. 8 is a plan view illustrating the pixel of FIG. 7.
Figure 9:
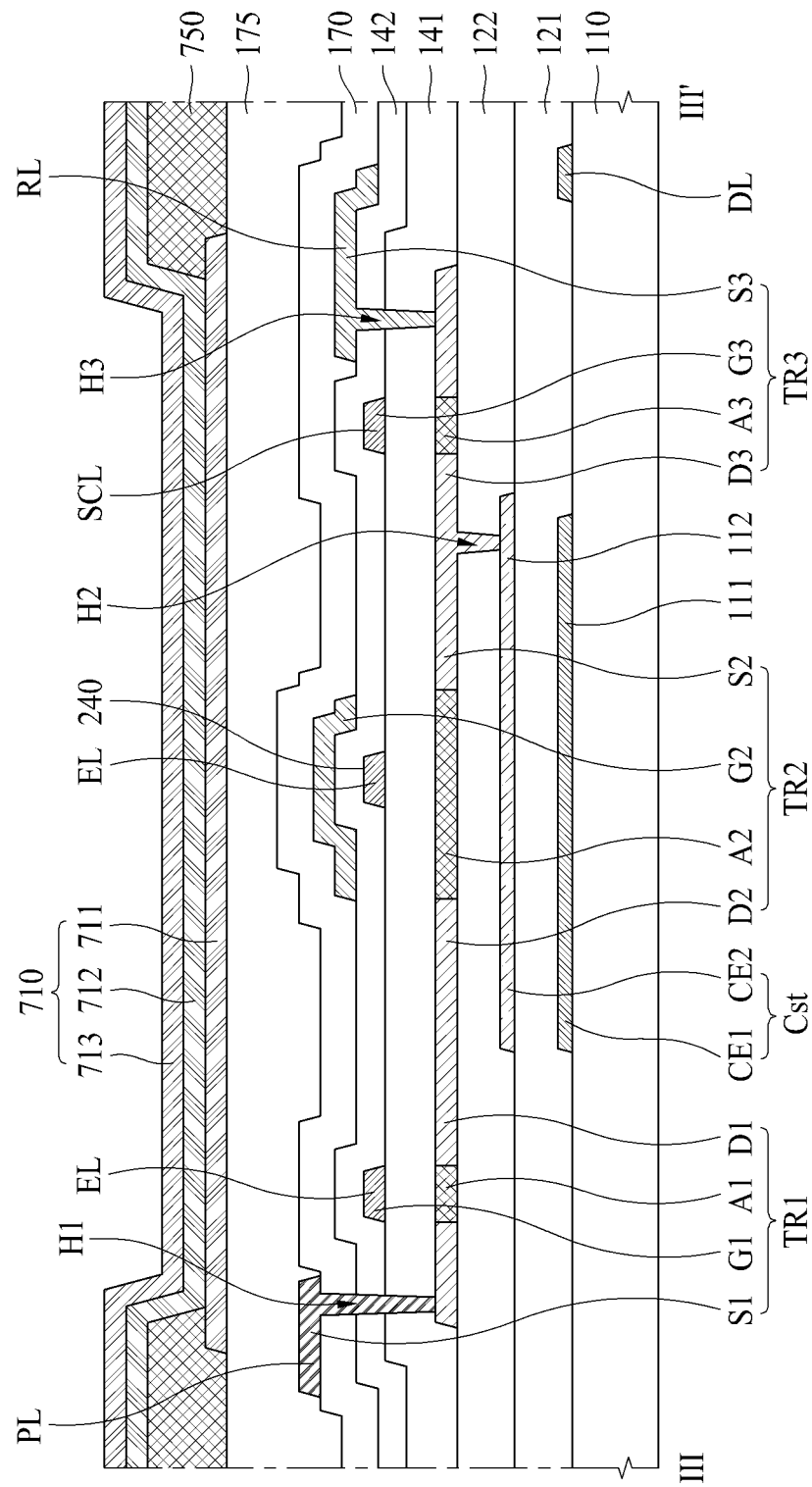
FIG. 9 is a cross-sectional view taken along line of FIG. 8.
Figure 10:
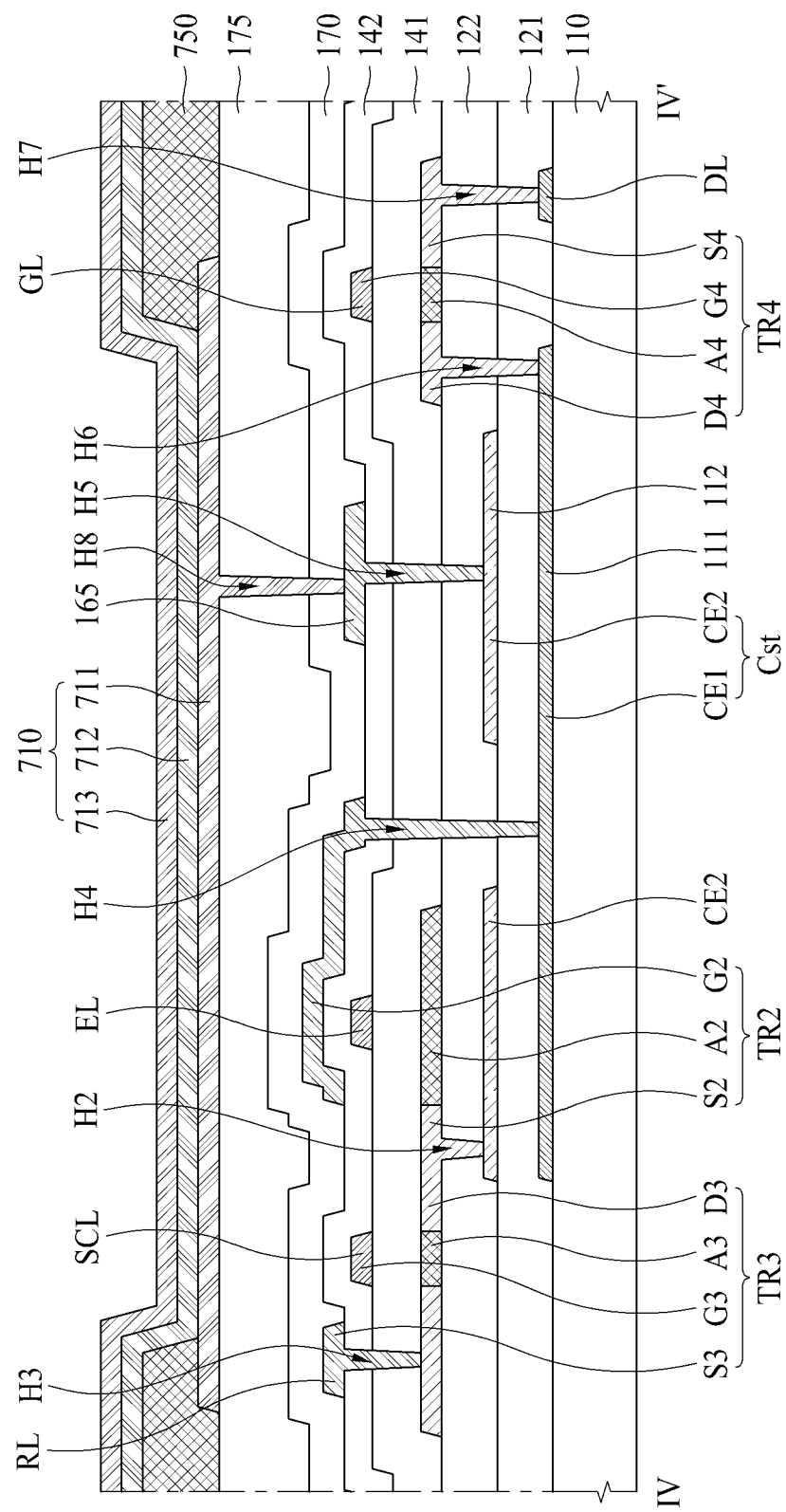
FIG. 10 is a cross-sectional view taken along line IV-IV' of FIG. 8.

FIG. 7 is a circuit view illustrating any one pixel P of FIG. 6, FIG. 8 is a plan view illustrating the pixel P of FIG. 7, FIG. 9 is a cross-sectional view taken along line of FIG. 8, and FIG. 10 is a cross-sectional view taken along line IV-IV' of FIG. 8.

The circuit view of FIG. 7 is an equivalent circuit view for the pixel P of the display device 600 that includes an organic light emitting diode OLED as a display element 710.

According to still another embodiment of the present disclosure, the pixel P of the display device 600 includes an organic light emitting diode OLED that is a display element 710, and a pixel driving circuit PDC that drives the display element 710. The display element 710 is connected to the pixel driving circuit PDC.

The pixel driving circuit PDC may include thin film transistors TR1, TR2, TR3, and TR4.

In detail, the pixel driving circuit PDC of FIG. 7 may include a first thin film transistor TR1 that is a light emitting control transistor, a second thin film transistor TR2 that is a driving transistor, a third thin film transistor TR3 that is a sensing transistor, and a fourth thin film transistor TR4 that is a switching transistor.

According to still another embodiment of the present disclosure, the pixel driving circuit PDC may include a first thin film transistor TFT1 and a second thin film transistor TFT2 of the thin film transistor substrates 100, 200, 300, 400, and 500 described above.

For example, as the first thin film transistor TR1, which is a light emitting control transistor, the first thin film transistor TFT1 of the thin film transistor substrates 100, 200, 300, 400, and 500 described above may be applied. As the second thin film transistor TR2, which is the driving transistor, the second thin film transistor TFT2 of the thin film transistor substrates 100, 200, 300, 400, and 500 described above may be applied.

Signal lines DL, EL, GL, PL, SCL and RL for supplying the driving signal to the pixel driving circuit PDC are disposed in the pixel P.

The data voltage Vdata is supplied to the data line DL, the scan signal SS is supplied to the gate line GL, the driving voltage Vdd for driving the pixel is supplied to the driving power line PL, the reference voltage Vref is supplied to the reference line RL, and the sensing control signal SCS is supplied to the sensing control line SCL. Also, an emission control signal EM is supplied to the emission control line EL.

The first thin film transistor TR1 serves as a light emitting control transistor for controlling the emission time of the second thin film transistor TR2. The first thin film transistor TR1 transmits the driving voltage Vdd to the second thin film transistor TR2 or shields the driving voltage Vdd in accordance with the emission control signal EM. When the first thin film transistor TR1 is turned on, a current is supplied to the second thin film transistor TR2 to output light from the display element 710.

The fourth thin film transistor TR4, which is a switching transistor, is connected to the gate line GL and the data line DL. The second thin film transistor TR2, which is a driving transistor, controls the magnitude of the current output to the display element 710 in accordance with the data voltage Vdata transmitted through the fourth thin film transistor TR4. The third thin film transistor TR3, which is a sensing transistor, senses the characteristics of the second thin film transistor TR2.

A storage capacitor Cst is positioned between the gate electrode of the second thin film transistor TR2 and the display element 710.

In detail, the fourth thin film transistor TR4 is turned on by the scan signal SS supplied to the gate line GL, and transmits the data voltage Vdata supplied to the data line DL to the gate electrode of the second thin film transistor TR2.

The third thin film transistor TR3 is connected to the reference line RL and turned on or off by the sensing control signal SCS, and senses the characteristics of the second thin film transistor TR2, which is a driving transistor, for the sensing period.

The fourth thin film transistor TR4 is connected to the gate line GL and the data line DL, and is turned on or off by the scan signal SS supplied through the gate line GL.

The data line DL provides the data voltage Vdata to the pixel driving circuit PDC, and the first thin film transistor TR1 controls applying of the data voltage Vdata.

The driving power line PL provides the driving voltage Vdd to the display element 710, and the second thin film transistor TR2 controls the driving voltage Vdd. The driving voltage Vdd is a pixel driving voltage for driving the organic light emitting diode OLED that is the display element 710.

When the fourth thin film transistor TR4 is turned on by the scan signal SS applied from the gate driver 320 through the gate line GL, the data voltage Vdata supplied through the data line DL is supplied to the gate electrode of the second thin film transistor TR2 connected to the display element 710. The data voltage Vdata is charged in the storage capacitor Cst formed between the gate electrode, i.e., the second node n2 and the source electrode, i.e., the first node n1 of the second thin film transistor TR2.

The amount of the current supplied to the organic light emitting diode OLED, which is the display element 710, is controlled through the second thin film transistor TR2 in accordance with the data voltage Vdata, whereby a gray scale of the light output from the display element 710 may be controlled.

The pixel driving circuit PDC according to still another embodiment of the present disclosure may be formed in a variety of structures other than those described above. The pixel driving circuit PDC may include, for example, five or more thin film transistors.

Referring to FIGS. 8, 9 and 10, the first thin film transistor TR1, the second thin film transistor TR2, the third thin film transistor TR3 and the fourth thin film transistor TR4 are disposed on a base substrate 110.

The base substrate 110 may be made of glass or plastic. As the base substrate 110, plastic having flexible properties, for example, polyimide (PI), may be used.

Referring to FIGS. 9 and 10, a first light shielding layer 111 is disposed on the base substrate 110. In addition, a data line DL may be disposed on the base substrate 110.

A first buffer layer 121 may be disposed on the first light shielding layer 111. A second light shielding layer 112 may be disposed on the first buffer layer 121, and a second buffer layer 122 may be disposed on the second light shielding layer 112.

The active layers A1, A2, A3 and A4 are disposed on the second buffer layer 122.

Referring to FIGS. 8 and 9, a first active layer A1 of the first thin film transistor TR1, a second active layer A2 of the second thin film transistor TR2, and a third active layer A3 of the third thin film transistor TR3 may be integrally formed on the second buffer layer 122. The first active layer A1, the second active layer A2 and the third active layer A3, which are integrally formed, may constitute a first block.

A portion of the first active layer A1 may be conductorized to serve as a drain electrode D1 of the first thin film transistor TR1.

A portion of the second active layer A2 may be conductorized to serve as a drain electrode D2 of the second thin film transistor TR2, and another portion of the second active layer A2 may be conductorized to serve as a source electrode S2 of the second thin film transistor TR2.

A portion of the third active layer A3 may be conductorized to serve as a drain electrode D3 of the third thin film transistor TR3.

Referring to FIGS. 8 and 9, the second active layer A2 of the second thin film transistor TR2 may be connected to the second light shielding layer 112 through a second contact hole H2. The second light shielding layer 112 may be connected to the source electrode S2 of the second thin film transistor TR2.

Referring to FIGS. 8 and 10, a fourth active layer A4 of the fourth thin film transistor TR4 is separately formed on the second buffer layer 122. The fourth active layer A4 may constitute a second block distinguished from the first active layer A1, the second active layer A2 and the third active layer A3.

A portion of the fourth active layer A4 may be conductorized to serve as a drain electrode D4 of the fourth thin film transistor TR4, and another portion of the fourth active layer A4 may be conductorized to serve as a source electrode S4 of the fourth thin film transistor TR4.

Referring to FIGS. 8, 9 and 10, the first active layer A1 of the first thin film transistor TR1 that is a light emitting control transistor, and the second active layer A2 of the second thin film transistor TR2 that is a driving transistor may be integrally formed. The first active layer A1 of the first thin film transistor TR1 that is a light emitting control transistor, and the second active layer A2 of the second thin film transistor TR2 that is a driving transistor may be distinguished from the fourth active layer A4 of the fourth thin film transistor TR4 that is a switching transistor.

In addition, the third active layer A3 of the third thin film transistor TR3 that is a sensing transistor may be integrated with the first active layer A1 of the first thin film transistor TR1 that is a light emitting control transistor, and the second active layer A2 of the second thin film transistor TR2 that is a driving transistor. The third active layer A3 of the third thin film transistor TR3 that is a sensing transistor may be distinguished from the fourth active layer A4 of the fourth thin film transistor TR4 that is a switching transistor.

Referring to FIGS. 8 and 10, the fourth active layer A4 of the fourth thin film transistor TR4 may be connected to the first light shielding layer 111 through a sixth contact hole H6. In addition, the fourth active layer A4 of the fourth thin film transistor TR4 may be connected to the data line through a seventh contact hole H7.

A first gate insulating layer 141 is disposed on the active layers A1, A2, A3 and A4.

An emission control line EL, a sensing control line SCL and a gate line GL are disposed on the first gate insulating layer 141.

A portion of the emission control line EL overlapped with the first active layer A1 becomes a first gate electrode G1 of the first thin film transistor TR1. Further, another portion of the emission control line EL overlapped with the second active layer A2 becomes the auxiliary gate electrode 240. That is, the first gate electrode G1 and the auxiliary gate electrode 240 may be portions of the emission control line EL.

According to still another embodiment of the present disclosure, the first gate electrode G1 and the auxiliary gate electrode 240 may be a portion of the emission control line EL. Therefore, the emission control signal EM may be applied to the first gate electrode G1 and the auxiliary gate electrode 240.

A portion of the sensing control line SCL overlapped with the third active layer A3 becomes a third gate electrode G3 of the third thin film transistor TR3.

Referring to FIGS. 8 and 10, a portion of the gate line GL overlapped with the fourth active layer A4 becomes a fourth gate electrode G4 of the fourth thin film transistor TR4.

A second gate insulating layer 142 is disposed on the emission control line EL, the sensing control line SCL and the gate line GL.

A reference line RL and a second gate electrode G2 of the second thin film transistor TR2 are disposed on the second gate insulating layer 142. A pad electrode 165 is disposed on the second gate insulating layer 142.

The reference line RL is connected to the third active layer A3 of the third thin film transistor TR3 through a third contact hole H3. The reference line RL may serve as a source electrode S3 of the third thin film transistor TR3.

Referring to FIG. 10, the second gate electrode G2 of the second thin film transistor TR2 may be connected to the first light shielding layer 111 through a fourth contact hole H4. As a result, the second gate electrode G2 may be connected to the fourth thin film transistor TR4 through the first light shielding layer 111.

The data voltage Vdata supplied through the data line DL may be supplied to the second gate electrode G2 of the second thin film transistor TR2 via the fourth thin film transistor TR4 and the first light shielding layer 111.

The first light shielding layer 111 connected to the second gate electrode G2 may be a first capacitor electrode CE1 of the storage capacitor Cst.

The second light shielding layer 112 connected to the source electrode S2 of the second thin film transistor TR2 may be the second capacitor electrode CE2 of the storage capacitor Cst.

As a result, the first capacitor electrode CE1 and the second capacitor electrode CE2 may be overlapped with each other to form the storage capacitor Cst.

Since the first light shielding layer 111 disposed below the thin film transistors TR1, TR2, TR3 and TR4 may be the first capacitor electrode CE1, and the second light shielding layer 112 may be the second capacitor electrode CE2, the storage capacitor Cst of a large area may be formed regardless of the area of the thin film transistors TR1, TR2, TR3 and TR4.

Referring to FIG. 10, the pad electrode 165 is connected to the second light shielding layer 112 through a fifth contact hole H5. As a result, the pad electrode 165 may be connected to the source electrode S2 of the second thin film transistor TR2 and the storage capacitor Cst.

An interlayer insulating layer 170 is disposed on the reference line RL, the second gate electrode G2 and the pad electrode 165.

A driving power line PL is disposed on the interlayer insulating layer 170.

The driving power line PL may be connected to the first active layer A1 of the first thin film transistor TR1 through a first contact hole H1. The driving power line PL may serve as a source electrode S1 of the first thin film transistor TR1.

The driving voltage Vdd may be transferred to the first thin film transistor TR1 through the driving power line PL.

A planarization layer 175 is disposed on the driving power line PL. The planarization layer 175 planarizes upper portions of the thin film transistors TR1, TR2, TR3 and TR4, and protects the thin film transistors TR1, TR2, TR3 and TR4.

A first electrode 711 of the display element 710 is disposed on the planarization layer 175. Referring to FIG. 10, the first electrode 711 of the display element 710 is connected to the pad electrode 165 through an eighth contact hole H8. As a result, the first electrode 711 of the display element 710 may be connected to the source electrode S2 of the second thin film transistor TR2 and the storage capacitor Cst.

A bank layer 750 is disposed at an edge of the first electrode 711 of the display element 710. The bank layer 750 defines a light emission area of the display element 710.

An organic light emitting layer 712 is disposed on the first electrode 711, and a second electrode 713 is disposed on the organic light emitting layer 712. Therefore, the display element 710 is completed. The display element 710 shown in FIG. 10 is an organic light emitting diode OLED. Therefore, the display device 600 according to one embodiment of the present disclosure is an organic light emitting display device.

According to the present disclosure, the following advantageous effects may be obtained.

According to one embodiment of the present disclosure, since a large number of thin film transistors and the lines connected thereto may be efficiently disposed, the thin film transistors may be integrated with high density. In particular, according to one embodiment of the present disclosure, since the function of the thin film transistor may be actively exerted even though the signal line overlaps the gate electrode of the thin film transistor, space utilization is excellent. Further, according to one embodiment of the present disclosure, the capacitor area may be easily ensured.

In the display device according to one embodiment of the present disclosure, even though the emission control line overlaps the gate electrode of the driving transistor, driving of the driving transistor may be actively controlled. Therefore, since it is easy to dispose the element in the display device and it is easy to make sure of the space for the storage capacitor, the driving voltage of the pixel may be stably charged and controlled, whereby the display device may have excellent display performance.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, all variations or modifications derived from the meaning, scope, and equivalent concept of the present disclosure fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thin film transistor substrate comprising:
   a first thin film transistor and a second thin film transistor on a base substrate,
   the first thin film transistor including:
   a first active layer on the base substrate; and
   a first gate electrode spaced apart from the first active layer,
   the second thin film transistor including:
   a second active layer on the base substrate;
   a second gate electrode spaced apart from the second active layer; and
   an auxiliary gate electrode between the second active layer and the second gate electrode,
   wherein the first active layer and the second active layer are integrally formed and connected to each other,
   wherein the auxiliary gate electrode is integrally formed and connected to the first gate electrode and spaced apart from the second active layer and the second gate electrode,
   wherein the second gate electrode overlaps at least a portion of the auxiliary gate electrode,
   wherein the second active layer includes:
   a channel portion;
   a first connection portion that is in contact with one side of the channel portion; and
   a second connection portion that is in contact with other side of the channel portion, and
   wherein a portion of the channel portion overlaps the auxiliary gate electrode, and other portion of the channel portion does not overlap the auxiliary gate electrode.

2. The thin film transistor substrate of claim 1, wherein a same voltage as that of the first gate electrode is applied to the auxiliary gate electrode.

3. The thin film transistor substrate of claim 1, wherein the first thin film transistor is configured to be turned on when the second thin film transistor is turned on.

4. The thin film transistor substrate of claim 1, wherein a first gate voltage is applied to the first gate electrode when a second gate voltage is applied to the second gate electrode.

5. The thin film transistor substrate of claim 1, wherein the other portion of the channel portion, which does not overlap the auxiliary gate electrode, overlaps the second gate electrode.

6. The thin film transistor substrate of claim 1, wherein a portion of the channel portion, which is toward the first connection portion, overlaps the auxiliary gate electrode and does not overlap the second gate electrode.

7. The thin film transistor substrate of claim 1, wherein a portion of the channel portion, which is toward the second connection portion, overlaps the auxiliary gate electrode and does not overlap the second gate electrode.

8. The thin film transistor substrate of claim 1, wherein the first active layer and the second active layer include at least one of an IGZO(InGaZnO)-based oxide semiconductor material, an IZO(InZnO)-based oxide semiconductor material, an IGZTO(InGaZnSnO)-based oxide semiconductor material, an ITZO(InSnZnO)-based oxide semiconductor material, a FIZO(FeInZnO)-based oxide semiconductor material, a ZnO-based oxide semiconductor material, a SIZO(SiInZnO)-based oxide semiconductor material, a ZnON(Zn-Oxynitride)-based oxide semiconductor material, a GZO(GaZnO)-based oxide semiconductor material, an IGO(InGaO)-based oxide semiconductor material, or a GZTO(GaZnSnO)-based oxide semiconductor material.

9. The thin film transistor substrate of claim 1, wherein each of the first active layer and the second active layer includes:
   a first oxide semiconductor layer; and
   a second oxide semiconductor layer on the first oxide semiconductor layer.

10. The thin film transistor substrate of claim 1, further comprising:
    a first light shielding layer on the base substrate; and
    a second light shielding layer on the first light shielding layer,
    wherein the first light shielding layer and the second light shielding layer are spaced apart from each other and overlap each other,
    wherein one of the first light shielding layer and the second light shielding layer is coupled to the second active layer, and the other one of the first light shielding layer and the second light shielding layer is coupled to the second gate electrode.

11. The thin film transistor substrate of claim 10, wherein the first light shielding layer and the second light shielding layer form a capacitor.

12. A display device comprising:
    a thin film transistor substrate, the thin film transistor substrate including a first thin film transistor and a second thin film transistor on a base substrate,
    the first thin film transistor including:
    a first active layer on the base substrate; and a first gate electrode spaced apart from the first active layer, the second thin film transistor including:

a second active layer on the base substrate;

a second gate electrode spaced apart from the second active layer; and an auxiliary gate electrode between the second active layer and the second gate electrode, wherein the first active layer and the second active layer are integrally formed and connected to each other, wherein the auxiliary gate electrode is integrally formed with the first gate electrode and spaced apart from the second active layer and the second gate electrode, wherein the second gate electrode overlaps at least a portion of the auxiliary gate electrode, wherein the second active layer includes:

a channel portion;

a first connection portion that is in contact with one side of the channel portion; and a second connection portion that is in contact with other side of the channel portion, and wherein a portion of the channel portion overlaps the auxiliary gate electrode, and other portion of the channel portion does not overlap the auxiliary gate electrode.

13. The display device of claim 12, wherein the first thin film transistor is a light emitting control transistor, and the second thin film transistor is a driving transistor.

14. The display device of claim 12, wherein an emission control signal is applied to the first gate electrode and the auxiliary gate electrode.

15. The display device of claim 12, wherein the first gate electrode and the auxiliary gate electrode are portions of an emission control line.

16. The display device of claim 12, further comprising a first light shielding layer on the base substrate; and a second light shielding layer on the first light shielding layer, wherein the first light shielding layer and the second light shielding layer are spaced apart from each other and overlap each other, wherein one of the first light shielding layer and the second light shielding layer is coupled to the second active layer, and the other one of the first light shielding layer and the second light shielding layer is coupled to the second gate electrode, and wherein a storage capacitor is formed by overlap between the first light shielding layer and the second light shielding layer.

17. The display device of claim 12, further comprising a driving transistor, a light emitting control transistor, and a switching transistor, wherein an active layer of the driving transistor and an active layer of the light emitting control transistor are integrally formed, and wherein the active layer of the driving transistor and the active layer of the light emitting control transistor are distinguished from an active layer of the switching transistor.

18. The display device of claim 17, further comprising a sensing transistor, wherein an active layer of the sensing transistor is integrally formed with the active layer of the driving transistor and the active layer of the light emitting control transistor, and wherein the active layer of the sensing transistor is distinguished from the active layer of the switching transistor.

19. A display device comprising:

a first thin film transistor;

a second thin film transistor adjacent to the first thin film transistor;

an active layer disposed in the first thin film transistor and disposed in the second thin film transistor;

a first gate electrode of the first thin film transistor spaced apart from the active layer;

an auxiliary gate electrode of the second thin film transistor spaced apart from the active layer, the auxiliary gate electrode formed continuous and integral with the first gate electrode; and a second gate electrode of the second thin film transistor spaced apart from the auxiliary gate electrode, wherein the active layer disposed in the second thin film transistor includes a channel portion, and wherein a portion of the channel portion overlaps the auxiliary gate electrode, and other portion of the channel portion does not overlap the auxiliary gate electrode.

20. The display device of claim 19, wherein the active layer disposed in the first and second thin film transistors, in operation, serves as an active layer of the first thin film transistor and an active layer of the second thin film transistor.

21. The display device of claim 19, wherein the active layer includes a first oxide semiconductor layer and a second oxide semiconductor layer, the first oxide semiconductor layer being stacked on the second oxide semiconductor layer.

22. The display device of claim 19, wherein the active layer includes:

a first channel portion that overlaps the first gate electrode of the first thin film transistor;

a second channel portion that overlaps the second gate electrode of the second thin film transistor;

a first connection portion adjacent to the first channel portion;

a second connection portion between the first channel portion and the second channel portion; and a third connection portion adjacent to the second channel portion.

23. The display device of claim 19, wherein the active layer includes:

a first channel portion that overlaps the first gate electrode of the first thin film transistor;

a second channel portion that overlaps the second gate electrode of the second thin film transistor;

a first connection portion adjacent to the first channel portion;

a second connection portion between the first channel portion and the second channel portion; and a third connection portion adjacent to the second channel portion, wherein the second connection portion does not overlap with the first gate electrode of the first thin film transistor and the second gate electrode of the second thin film transistor.

24. The display device of claim 23, wherein a width of the second channel portion of the active layer is equal to or greater than a width of the second gate electrode of the second thin film transistor.

25. The display device of claim 23, wherein a width of the first channel portion of the active layer is equal to or greater than a width of the first gate electrode of the first thin film transistor.

* * * * *